(12) United States Patent
Chen (10) Patent No.: US 11,329,563 B2
(45) Date of Patent: May 10, 2022

(54) BUCK-BOOST CONVERTER CIRCUIT, CONTROL CIRCUIT AND ASSOCIATED CONTROL METHOD

(71) Applicant: Chengdu Monolithic Power Systems Co., Ltd., Chengdu (CN)

(72) Inventor: Changjiang Chen, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 36 days.

(21) Appl. No.: 16/988,380

(22) Filed: Aug. 7, 2020

(65) Prior Publication Data

US 2022/0045613 A1    Feb. 10, 2022

(51) Int. Cl.
*H02M 3/158* (2006.01)
*H02M 1/00* (2006.01)

(52) U.S. Cl.
CPC ........ *H02M 3/1582* (2013.01); *H02M 1/0025* (2021.05)

(58) Field of Classification Search
CPC .............................. H02M 3/1582; H02M 1/08
See application file for complete search history.

(56) References Cited

U.S. PATENT DOCUMENTS

| 9,966,851 | B2 | 5/2018 | Ouyang | |
|---|---|---|---|---|
| 10,075,075 | B2 | 9/2018 | Zhang | |
| 2012/0032658 | A1* | 2/2012 | Casey | H02M 3/1582 323/271 |
| 2014/0354250 | A1* | 12/2014 | Deng | H02M 3/157 323/271 |
| 2015/0069958 | A1* | 3/2015 | Yang | H02J 7/007 320/107 |
| 2016/0190931 | A1* | 6/2016 | Zhang | H02M 3/1582 323/271 |
| 2016/0315535 | A1* | 10/2016 | Ouyang | H02M 3/1582 |
| 2017/0279359 | A1* | 9/2017 | Goncalves | H02M 1/088 |

* cited by examiner

Primary Examiner — Alex Torres-Rivera
(74) *Attorney, Agent, or Firm* — Perkins Coie LLP (57) ABSTRACT

A buck-boost converter working in a buck mode with buck switching cycles, a boost mode with boost switching cycles or a buck-boost mode with buck-boost switching cycles. Each of the buck-boost switching cycles has an AC phase, an AD phase and a BD Phase, and the duty cycle of the AC phase is determined by a reference signal, a feedback signal and an inductor current sense signal, the duty cycle of the AD phase is controlled and maintained at a preset duty threshold, the time period of the buck-boost switching cycle equals the time period of the buck switching cycle and the time period of the boost switching cycle.

10 Claims, 6 Drawing Sheets

BUCK-BOOST CONVERTER CIRCUIT, CONTROL CIRCUIT AND ASSOCIATED CONTROL METHOD

CROSS-REFERENCE TO RELATED APPLICATION(S)

This application claims the benefit of CN application No. 201910001205.4 filed on Jan. 2, 2019 and incorporated herein by reference.

TECHNICAL FIELD

This disclosure relates generally to buck-boost converter, and more particularly but not exclusively relates to a control circuit of buck-boost converter.

BACKGROUND

Buck-boost converters can convert an input voltage into an output voltage higher than, equal to or lower than the input voltage and can generally provide an output voltage with a wide range. Therefore, buck-boost converters are widely used in power management applications.

Theoretically, a buck-boost converter works in a buck mode when the input voltage is higher than the output voltage, and works in a boost mode when the input voltage is lower than the output voltage, and works in a buck-boost mode when the input voltage is close to the output voltage. However, in practical, the existing buck-boost converter cannot transit smoothly from one mode to another among the buck mode, the boost mode and the buck-boost mode. Therefore, it is desired to provide a buck-boost converter that can transit from one mode to another seamlessly.

SUMMARY

In accomplishing the above and other objects, there has been provided a control circuit for a buck-boost converter in accordance with an embodiment of the present invention. A control circuit for regulating a buck-boost converter with an inductor and a switch module having a first power switch, a second power switch, a third power switch and a fourth power switch, wherein the first power switch and the second power switch are coupled in series between an input port and a reference ground with a first common node, the third power switch and the fourth power switch are coupled in series between an output port and the reference ground with a second common node, wherein the inductor is coupled between the first common node and the second common node, the switch module is controlled to on and off to convert an input voltage received at the input port to an output voltage at the output port, the control circuit comprises a buck mode control circuit, a boost mode control circuit and a buck-boost mode control circuit. The buck mode control circuit is configured to control the buck-boost converter to work in a buck-mode by regulating the switch module to operate with buck switching cycles continuously, wherein in each of the buck switching cycles, the first power switch and the second power switch are controlled to conduct on and off switching complementarily, while the third power switch is maintained at the off state and the fourth power switch is maintained at the on state, wherein each of the buck switching cycles comprises an AD phase during which both of the first power switch and the fourth power switch are in the on state and a BD phase during which both of the second power switch and the fourth power switch are in the on state. The boost mode control circuit is configured to control the buck-boost converter to work in a boost mode by regulating the switch module to operate with boost switching cycles continuously, wherein in each of the boost switching cycles, the third power switch and the fourth power switch are controlled to conduct on and off switching complementarily, while the first power switch is maintained at the on state and the second power switch is maintained at the off state, wherein each of the boost switching cycles comprises an AC phase during which both of the first power switch and the third power switch are in the on state and the AD phase. The buck-boost mode control circuit is configured to control the buck-boost converter to work in a buck-boost mode by regulating the switch module to work with buck-boost switching cycles continuously, wherein each of the buck-boost switching cycles comprises the AC phase, the AD phase and the BD phase, wherein the duty cycle of the AC phase is controlled and determined by a reference signal, a feedback signal indicative of the output voltage, and an inductor current sense signal indicative of a current flowing through the inductor, wherein the duty cycle of the AD phase is controlled and maintained at a preset duty threshold, and the time periods of the buck switching cycle, the boost switching cycle and the buck-boost switching cycle are all equal.

There has also been provided a buck-boost converter in accordance with an embodiment of the present invention. The buck-boost converter comprises a switch module, an inductor, a buck mode control circuit, a boost mode control circuit and a buck-boost mode control circuit. The switch module comprises a first power switch, a second power switch, a third power switch and a fourth power switch, wherein the first power switch and the second power switch are coupled in series between an input port and a reference ground with a first common node, the third power switch and the fourth power switch are coupled in series between an output port and the reference ground with a second common node, the switch module is controlled to on and off to convert an input voltage received at the input port to an output voltage at the output port. The inductor has a first terminal coupled to the first common node and a second terminal coupled to the second common node. The buck mode control circuit is configured to control the buck-boost converter to work in a buck mode by regulating the switch module to operate with buck switching cycles continuously, wherein in each of the buck switching cycles, the first power switch and the second power switch are controlled to conduct on and off switching complementarily, while the third power switch is maintained at the off state and the fourth power switch is maintained at the on state, wherein each of the buck switching cycles comprises an AD phase during which both of the first power switch and the fourth power switch are in the on state and a BD phase during which both of the second power switch and the fourth power switch are in the on state. The boost mode control circuit, configured to control the buck-boost converter to work in a boost mode by regulating the switch module to operate with boost switching cycles continuously, wherein in each of the boost switching cycles, the third power switch and the fourth power switch are controlled to conduct on and off switching complementarily, while the first power switch is maintained at the on state and the second power switch is maintained at the off state, wherein each of the boost switching cycles comprises an AC phase during which both of the first power switch and the third power switch are in the on state and the AD phase. The buck-boost mode control circuit is configured to control the buck-boost converter to work in a buck-boost mode by regulating the switch module to operate with buck-boost switching cycles continuously, wherein each of the buck-boost switching cycles comprises the AC phase, the AD phase and the BD phase, wherein the duty cycle of the AC phase is controlled and determined by a reference signal, a feedback signal indicative of the output voltage and an inductor current sense signal indicative of a current flowing through the inductor, wherein the duty cycle of the AD phase is controlled and maintained at a preset duty threshold, and the time periods of the buck switching cycle, the boost switching cycle and the buck-boost switching cycle are all equal.

There has also been provided a control method for a buck-boost converter in accordance with an embodiment of the present invention. The control method for regulating a buck-boost converter with an inductor and a switch module having a first power switch, a second power switch, a third power switch and a fourth power switch, wherein the first power switch and the second power switch are coupled in series between an input port and a reference ground with a first common node, the third power switch and the fourth power switch are coupled in series between an output port and the reference ground with a second common node, wherein the inductor is coupled between the first common node and the second common node, the switch module is controlled to on and off to convert an input voltage received at the input port to an output voltage at the output port, the control method comprises: setting the buck-boost converter to work in a buck mode, a boost mode or a buck-boost mode based on the input voltage and the output voltage, when the buck-boost converter is regulated to work in the buck mode, the switch module is regulated to operate with buck switching cycles continuously, wherein in each of the buck switching cycles, the first power switch and the second power switch are controlled to conduct on and off switching complementarily, while the third power switch is maintained at the off state and the fourth power switch is maintained at the on state, wherein each of the buck switching cycles comprise an AD phase during which both of the first power switch and the fourth power switch are in the on state and a BD phase during which both of the second power switch and the fourth power switch are in the on state, when the buck-boost converter is regulated to work in the boost mode, the switch module is regulated to operate with boost switching cycles continuously, wherein in each of the boost switching cycles, the third power switch and the fourth power switch are controlled to conduct on and off switching complementarily, while the first power switch is maintained at the on state and the second power switch is maintained at the off state, wherein each of the boost switching cycles comprises an AC phase during which both of the first power switch and the third power switch are in the on state, and the AD phase, and when the buck-boost converter is regulated to work in the buck-boost mode, the switch module is regulated to operate with buck-boost switching cycles continuously, wherein each of the buck-boost switching cycles comprises the AC phase, the AD phase and the BD phase, wherein the duty cycle of the AC phase is controlled and determined by a reference signal, a feedback signal indicative of the output voltage and an inductor current sense signal indicative of a current passing through the inductor, the duty cycle of the AD phase is controlled to a preset duty threshold, the time periods of the buck switching cycle, the boost switching cycle and the buck-boost switching cycle are all equal.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
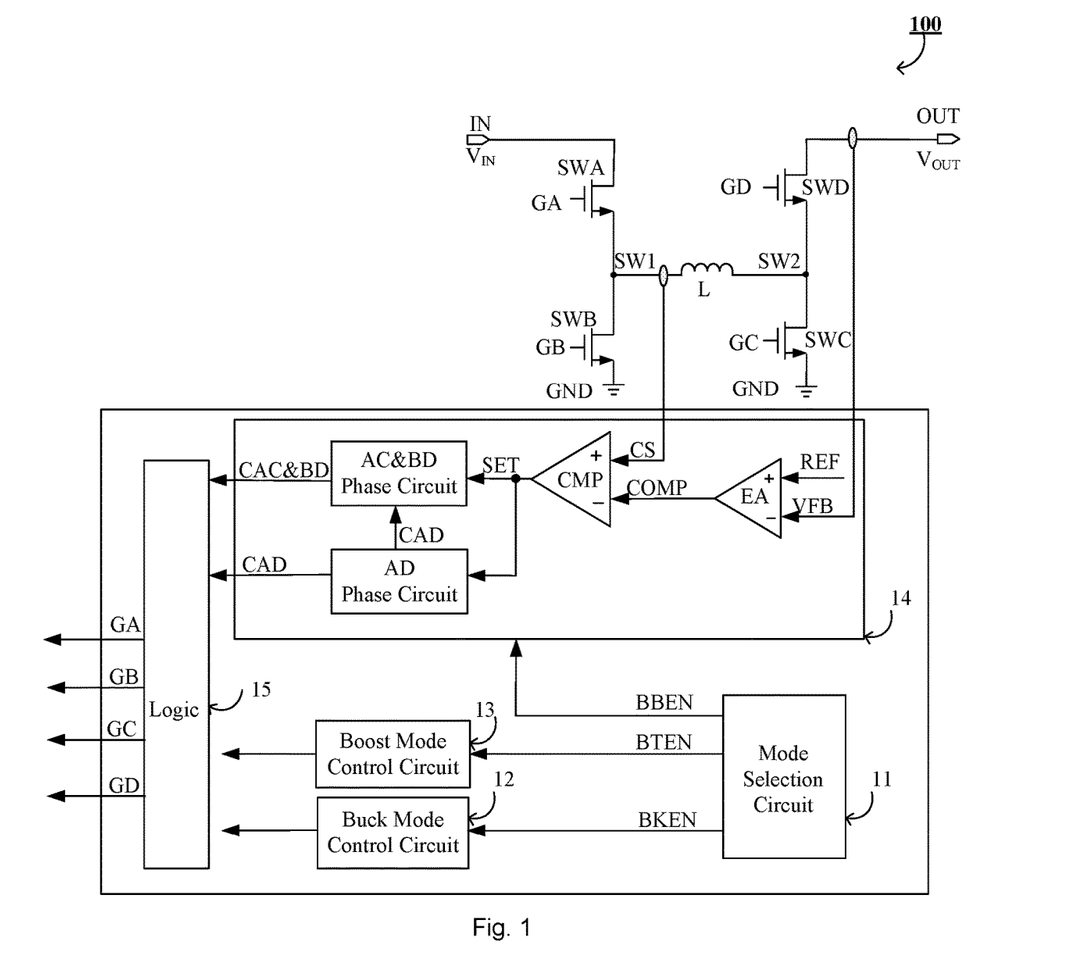
FIG. 1 illustrates a schematic diagram of a buck-boost converter 100 in accordance with an embodiment of the present invention.

FIG. 1 illustrates a schematic diagram of a buck-boost converter 100 in accordance with an embodiment of the present invention. The buck-boost converter 100 comprises an inductor and a switch module having a first power switch SWA, a second power switch SWB, a third power switch SWC and a fourth power SWD. The first power switch SWA and the second power switch SWB are coupled in series between an input terminal IN and a reference ground GND, and have a common connection SW1 referred to as a first common node SW1, the third power switch SWC and the fourth power switch SWD are coupled in series between an output terminal OUT and the reference ground GND, and have a common connection SW2 referred to as a second common node SW2. An inductor L is coupled between the first common node SW1 and the second common node SW2. The buck-boost converter 100 further comprises a control circuit to provide a first driving signal GA, a second driving signal GB, a third driving signal GC and a fourth driving signal GD respectively to control the on and off of the power switches SWA, SWB, SWC and SWD so as to convert an input voltage VIN received at the input terminal IN to an appropriate output voltage VOUT at the output terminal OUT. The buck-boost converter 100 works in the buck mode, the boost mode or the buck-boost mode according to the relative value of the input voltage VIN and the output voltage VOUT.

Referring to FIG. 1, the control circuit comprises a mode selection circuit 11, a buck mode control circuit 12, a boost mode control circuit 13, a buck-boost mode control circuit 14 and a logic circuit 15. The mode selection module 11 provides a buck mode enable signal BKEN, a boost mode enable signal BTEN and a buck-boost mode enable signal BBEN to control the buck-boost converter 100 to work in the buck mode, the boost mode or the buck-boost mode respectively. When the buck-boost converter 100 works in the buck mode, the third power switch SWC is maintained at the off state and the fourth power switch SWD is maintained at the on state, while the first power switch SWA and the second power switch SWB are controlled to conduct on and off switching complementarily, i.e., when the first power switch SWA is switched on, the second power switch SWB is switched off, and vice versa. In the buck mode, the switch module is regulated to operate in turn switching cycle by switching cycle, wherein the switching cycle during which the first power switch SWA and the second power switch SWB are operated to conduct on and off switching is referred to as a buck switching cycle. Thus during each of the buck switching cycles, when the first power switch SWA is switched on and the second power switch SWB is switched off, the first power switch SWA and the fourth power switch SWD are actually on, and this situation is referred to as an AD phase in the present invention, and when the first power switch SWA is switched off and the second power switch SWB is switched on, the second power switch SWB and the fourth power switch SWD are actually on, and this situation is referred to as a BD phase in the present invention. Each of the buck switching cycles comprises the AD phase during which both of the first power switch SWA and the fourth power switch SWD are in the on state and the BD phase during which both of the second power switch SWB and the fourth power switch SWD are in the on state. Thus, the time period of the buck switching cycle TBK is the sum of the time period of the AD phase TAD and the time period of the BD phase TBD, i.e., TBK=TAD+TBD. When the buck-boost converter 100 works in the buck mode, a fraction of the AD phase to one entire buck switching cycle is referred to as a buck duty cycle DBK which is determined by the input voltage VIN and the output voltage VOUT. In one embodiment, the buck-boost converter 100 has a buck duty threshold DBKTH which is configured to limit the buck duty cycle DBK in the buck switching cycles. In one embodiment, the buck duty threshold DBKTH is set to be a value of 85%, 90% or 95%. In another embodiment, the buck duty threshold DBKTH may be set to be values of other percentage.

When the buck-boost converter 100 is controlled to work in the boost mode, the first power switch SWA is maintained at the on state, the second power switch SWB is maintained at the off state, while the third power switch SWC and the fourth power switch SWD are controlled to conduct on and off switching complementarily, i.e., when the third power switch SWC is switched on, the fourth power switch SWD is switched off and vice versa. In the boost mode, the switch module is regulated to operate in turn switching cycle by switching cycle, wherein a switching cycle during which the third power switch SWC and the fourth power switch SWD are operated to conduct on and off switching is referred to as a boost switching cycle. Thus during each of the boost switching cycles, when the third power switch SWC is switched on and the fourth power switch SWD is switched off, the first power switch SWA and the third power switch SWC are actually on, and this situation is referred to as a AC phase in the present invention, and when the third power switch SWC is switched off and the fourth power switch SWD is switched on, the first power switch SWA and the fourth power switch SWD are actually on, and this situation is referred to as the AD phase in the present invention. Each of the boost switching cycles comprises the AC phase during which the first power switch SWA and the third power switch SWC are in the on state and the AD phase during which the first power switch SWA and the fourth power switch SWD are in the on state. Thus, the time period of the boost switching cycle TBT is the sum of the time period of the AC phase TAC and the time period of the AD phase TAD, i.e., TBT=TAC+TAD. When the buck-boost converter 100 works in the boost mode, a fraction of the AC phase to one entire boost switching cycle is referred to as a boost duty cycle DBT which is also determined by the input voltage VIN and the output voltage VOUT. In one embodiment, the buck-boost converter 100 has a boost duty threshold DBTTH which is configured to limit the boost duty cycle DBT. In one embodiment, the boost duty threshold DBTTH is set to be a value of 5%, 10% or 15%. In another embodiment, the boost duty threshold DBTTH may be set to be values of other percentage. The time period of the boost switching cycle TBT equals the time period of the buck switching cycle TBK.

When the buck-boost converter 100 works in the buck-boost mode, the switch module is regulated to operate with buck-boost switching cycles continuously, wherein each of the buck-boost switching cycles comprises the AC phase during which the first power switch SWA and the third power switch SWC are in the on state while the second power switch SWB and the fourth power switch SWD are in the off state, the AD phase during which the first power switch SWA and the fourth power switch SWD are in the on state while the second power switch SWB and the third power switch SWC are in the off state, and the BD phase during which the second power switch SWB and the fourth power switch SWD are in the on state while the first power switch SWA and the third power switch SWC are in the off state. Thus, the time period of the buck-boost switching cycle TBB is the sum of the time period of the AC phase TAC, the time period of the AD phase TAD and the time period of the BD phase TBD, i.e., TBB=TAC+TAD+TBD. In the buck-boost mode, a fraction of the AC phase to one entire buck-boost switching cycle is referred to as a duty cycle of the AC phase DAC, a fraction of the AD phase to one entire buck-boost switching cycle is referred to as an duty cycle of the AD phase DAD, and a fraction of the BD phase to one entire buck-boost switching cycle is referred to as a duty cycle of the BD phase DBD, thus for each of the buck-boost switching cycles, DAC+DAD+DBD=100%, wherein the duty cycle of the AC phase DAC is controlled and determined by a reference signal REF, a feedback signal VFB indicative of the output voltage VOUT, and an inductor current sense signal CS indicative of a current flowing through the inductor L, wherein the duty cycle of the AD phase DAD is controlled and maintained at a preset duty threshold DON1 which is less than the buck duty threshold DBKTH, wherein the time periods of the buck switching cycle, the boost switching cycle and the buck-boost switching cycle are all equal, i.e., TBB=TBK=TBT.

Referring to FIG. 1, the buck mode control circuit 12 may comprise a constant on time control mode, a constant off time control mode or a peak current pulse width modulation control mode. Considering the constant on time control mode, the constant off time control mode and the peak current pulse width modulation control mode are all routine techniques for one person with ordinary skill in this art, so the working principles are not described here for simplicity. Similarly, the boost mode control circuit 13 may also comprise the constant on time control mode, the constant off time control mode or the peak current pulse width modulation control mode.

Referring still to FIG. 1, the buck-boost mode control circuit 14 comprises an AC phase circuit, an AD phase circuit and a cycle period circuit. The AC phase circuit comprises an error amplifier EA and a comparator CMP, the error amplifier EA is configured to receive the reference signal REF and the feedback signal VFB and configured to generate a compensation signal COMP based on the reference signal REF and the feedback signal VFB. The comparator CMP is configured to compare the inductor current sense signal CS and the compensation signal COMP, and configured to generate a setting signal SET to control the duty cycle of the AC phase DAC based on the inductor current sense signal CS and the compensation signal COMP. The setting signal SET transits from a first state to a second state to terminate the AC phase when the inductor current sense signal CS is increased to reach the compensation signal COMP. The AD phase circuit is configured to control the switch module to work in the AD phase based on the setting signal SET, and further configured to generate an AD phase control signal CAD to control and maintain the duty cycle of the AD phase DAD at the preset duty threshold DON1. The cycle period circuit is coupled to the AC phase circuit and the AD phase circuit to receive the setting signal SET and the AD phase control signal CAD, and configured to generate a cycle period control signal CAC&BD to control the time period of the buck-boost switching cycle.

Figure 2:
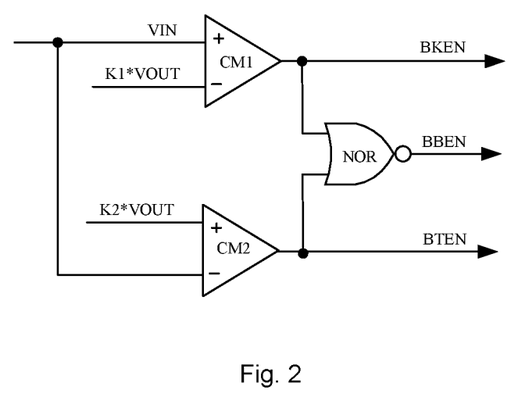
FIG. 2 illustrates a schematic diagram of a mode selection circuit 11 shown in FIG. 1 in accordance with an embodiment of the present invention.

FIG. 2 illustrates a circuit block diagram of a mode selection circuit 11 in accordance with an embodiment of the present invention. The mode selection circuit 11 comprises a buck comparator CM1, a boost comparator CM2 and a NOR gate. The buck comparator CM1 has a first input terminal configured to receive the input voltage VIN, a second input terminal configured to receive the output voltage VOUT by a first threshold K1, and an output terminal to provide the buck mode enable signal BKEN. When the input voltage VIN is higher than the output voltage VOUT by the first threshold K1, the mode selection circuit 11 is configured to provide the buck mode enable signal BKEN to control the buck-boost converter 100 to work in the buck mode, wherein the first threshold K1 is a constant higher than 1. The boost comparator CM2 has a first input terminal configured to receive the input voltage VIN, a second input terminal configured to receive the output voltage VOUT by a second threshold K2, and an output terminal to provide the boost mode enable signal BTEN. When the input voltage VIN is less than the output voltage VOUT by the second threshold K2, the mode selection circuit 11 is configured to provide the boost mode enable signal BTEN to control the buck-boost converter 100 to work in the boost mode, wherein the second threshold K2 is a constant less than 1 and higher than 0. The NOR gate has a first input terminal configured to receive the buck mode enable signal BKEN, a second input terminal configured to receive the boost enable signal BTEN, and an output terminal to provide the buck-boost mode enable signal BBEN. When the input voltage VIN is less than the output voltage VOUT by the first threshold K1 and higher than the output voltage VOUT by the second threshold K2, the mode selection circuit 11 is configured to provide the buck-boost mode enable signal BBEN to control the buck-boost converter 100 to work in the buck-boost mode.

The mode selection circuit 11 shown in FIG. 2 is configured to provide the buck mode enable signal BKEN, the boost mode enable signal BTEN and the buck-boost enable signal BBEN by comparing the input voltage VIN with the output voltage VOUT. In other embodiments, the mode selection circuit 11 may configure to generated the buck mode enable signal BKEN, the boost mode enable signal BTEN and the buck-boost enable signal BBEN by detecting the buck duty cycle DBK and the boost duty cycle DBT. The mode selection circuit 11 comprises a buck duty cycle sensing and comparison circuit and a boost duty cycle sensing and comparison circuit. The buck duty cycle sensing and comparison circuit is configured to sense the buck duty cycle DBK of the buck-boost converter 100 and to compare the buck duty cycle DBK with the buck duty threshold DBKTH, wherein when the buck duty cycle DBK is higher than the buck duty threshold DBKTH, the buck-boost converter 100 is regulated to transit from the buck mode to the buck-boost mode. The boost duty cycle sensing and comparison circuit is configured to sense the boost duty cycle DBT of the buck-boost converter 100 and to compare the boost duty cycle DBT with the boost duty threshold DBTTH, wherein when the boost duty cycle DBT is less than the boost duty threshold DBTTH, the buck-boost converter 100 is regulated to transit from the boost mode to the buck-boost mode.

Figure 3A:
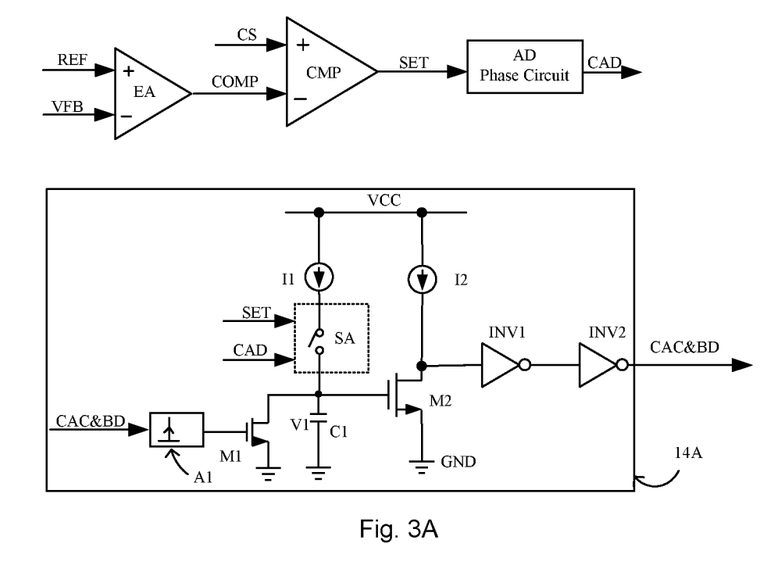
FIG. 3A illustrates a schematic diagram of a buck-boost mode control circuit 14 shown in FIG. 1 in accordance with an embodiment of the present invention.

FIG. 3A illustrates a schematic diagram of a buck-boost mode control circuit 14 shown in FIG. 1 in accordance with an embodiment of the present invention. The buck-boost mode control circuit 14 comprises the AC phase circuit, the AD phase circuit and the cycle period circuit. The AC phase circuit comprises the error amplifier EA and the comparator CMP, the error amplifier EA is configured to receive the reference signal REF and the feedback signal VFB and configured to generate the compensation signal COMP based on the reference signal REF and the feedback signal VFB. The comparator CMP is configured to compare the inductor current sense signal CS with the compensation signal COMP, and configured to generate the setting signal SET to control the duty cycle of the AC phase DAC based on the setting signal SET and the compensation signal COMP. The error amplifier EA has a first input terminal to receive the reference signal REF, a second input terminal to receive the feedback signal VFB, the error amplifier EA amplifies the error between the feedback signal VFB and the inductor current sense signal CS. The comparator CMP has s first input terminal to receive the inductor current sense signal CS, a second input terminal to receive the compensation signal COMP, the comparator CMP compares the inductor current sense signal CS with the compensation signal COMP, and when the inductor current sense signal CS is increased to reach the compensation signal COMP, the setting signal SET transits from a first state to a second state to terminate the AC phase. The time period of the AD phase is determined by the time period of the setting signal SET maintained at the first state, thus the duty cycle of the AD phase DAD is also determined by the setting signal SET.

The cycle period circuit 14A is configured to provide a cycle period control signal CAC&BD to control the period time of the buck-boost switching cycle to be equal to the period time of the buck switching cycle and the period time of the boost switching cycle. In FIG. 3A, the cycle period circuit 14A comprises a first current source I1, a switch SA, a capacitor C1, a first transistor M1, a second current source I2, a second transistor M2, a first inverter INV2, a second inverter INV2 and a trigger A1 which are connected as shown in FIG. 3A. the first current source I1, the switch SA and the capacitor C1 are coupled in series between a supply voltage VCC and a reference ground GND. The first current source I1 has a first terminal coupled to the supply voltage VCC, and a second terminal. The switch SA has a first terminal coupled to the second terminal of the first current source I1, and a second terminal. The capacitor C1 has a first terminal coupled to the second terminal of the switch SA and a second terminal coupled to the reference ground GND. The first transistor M1 has a first terminal coupled to the first terminal of the capacitor C1, a second terminal coupled to the reference ground GND, and a control terminal. The second current source I2 has a first terminal coupled to the supply voltage VCC, and a second terminal. The second transistor M2 has a first terminal coupled to the second terminal of the second current source I2, a second terminal coupled to the reference ground GND and a control terminal coupled to the first terminal of the capacitor C1. The first inverter INV1 has an input terminal coupled to the first terminal of the second transistor M2, and an output terminal. The second inverter INV2 has an input terminal coupled to the output terminal of the first inverter INV1, and an output terminal to provide the cycle period control signal CAC&BD. The trigger A1 is configured to provide a pulse signal to the control terminal of the first transistor M1 based on the cycle period control signal CAC&BD. The working principle of the cycle period control circuit is: the switch SA is controlled to turn on by the setting signal SET during the AC phase of the buck-boost switching cycle, the first current source I1 charges the capacitor C1 and the capacitor C1 has a first voltage V1 which is increased from zero with the charging. The first current source I1 keeps on charging until the AC phase is end, and the AD phase circuit is enabled. The switch SA is controlled to turn off once the AC phase is end. The switch SA is controlled and maintained at the off state until the AD phase is end and is controlled to turn on again. The switch SA turns on and the first current source I1 continues to charge the first capacitor C1 until the first voltage V1 is increased to reach the threshold voltage VTH of the second transistor M2. The cycle period control signal CAC&BD transits from a first state to a second state to end one buck-boost switching cycle, and the time period of the buck-boost switching cycle is determined by the time period of the cycle period control signal CAC&BD maintained at the first state.

In other embodiments, the cycle period control circuit may comprise other structural topologic, any structural topologic that can generate the cycle period control signal CAC&BD to control the time period of the buck-boost switching cycle equal to the time period of the buck switching cycle and the time period of the boost switching cycle is suitable.

Figure 3B:
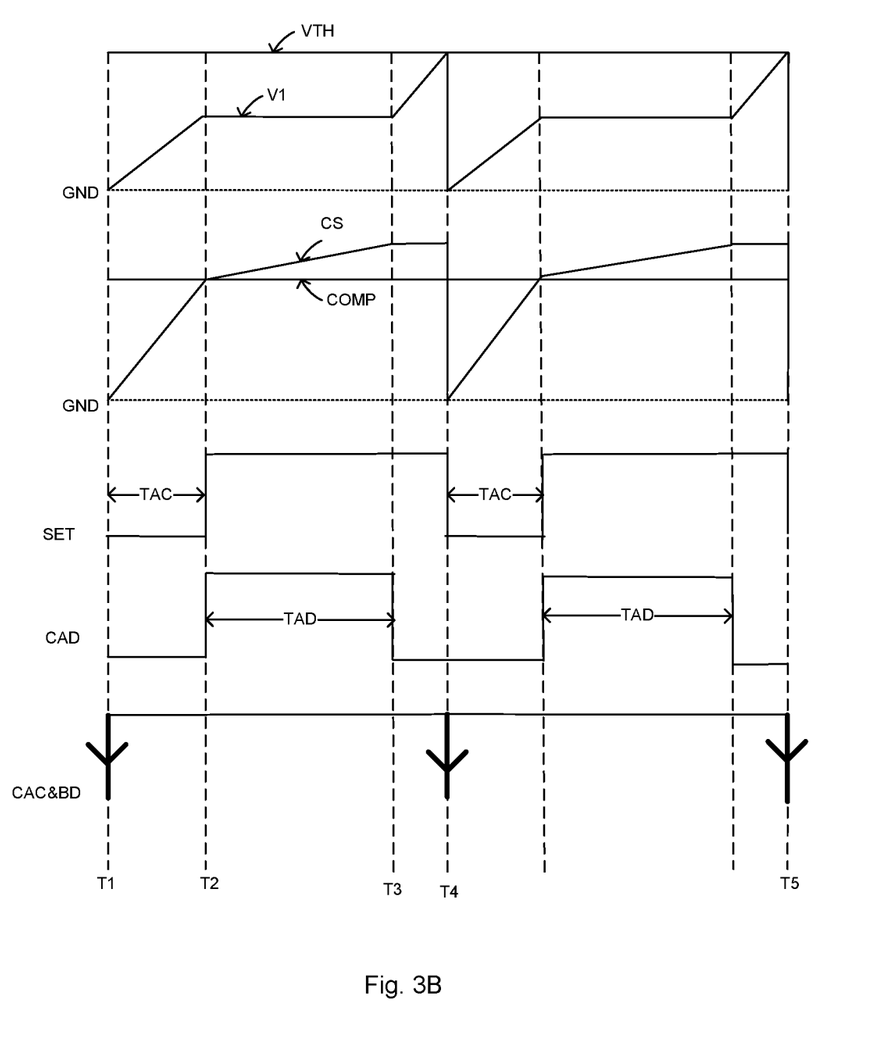
FIG. 3B illustrates an operating waveform diagram of the buck-boost mode control circuit 14 shown in FIG. 3A in accordance with an embodiment of the present invention.

FIG. 3B illustrates the waveform diagram of the buck-boost mode control circuit 14 shown in FIG. 3A in accordance with an embodiment of the present invention. In FIG. 3B, the falling edge of the cycle period control signal CAC&BD comes at the moment T1, and the first transistor M1 is turned on for a very short time at the trigger of the falling edge of the cycle period control signal CAC&BD, thus the first voltage V1 on the capacitor C1 is discharged to zero quickly and a buck-boost switching cycle starts. The first transistor M1 is turned off once the first voltage V1 is discharged to zero. At the moment T1, the inductor current sense signal CS is less than the compensation signal COMP and the inductor current sense signal CS is increased to reach the compensation signal COMP at the moment T2, so the setting signal SET transits from the first state of logic low to the second state of logic high to terminate the AC phase at the moment T2, and the time period of the AC phase TAC is determined by the time period when the setting signal SET is maintained at the first state. The AD phase control signal CAD transits from a first state of logic low to a second state of logic high at the trigger of the rising edge of the setting signal SET. The AD phase control signal CAD is maintained at the second state of logic high for a period time equal to DON1*TBB to control the time period of the AD phase. The switch SA is controlled to turn on by the setting signal SET during the period from the moment T1 to the moment T2 and controlled to turn off during the time period from the moment T2 to the moment T3 by the AD phase control signal CAD, so the first voltage V1 increases during the period from the moment T1 to the moment T2 and keeps constant during the period from the moment T2 to the moment T3. At the moment T3, the AD phase control signal CAD transits from the second state of logic high to the first state of logic low to terminate the AD phase and the switch SA is controlled turned on again. The first current source I1 starts to charge the capacitor C1 from the moment T3 and keeps on charging until the moment T4 for the first voltage V1 is increased to reach the threshold voltage VTH of the second transistor M2 and the second transistor is controlled to turn on which cause the falling edge of the cycle period control signal CAC&BD comes. At the moment T4, the first transistor M1 is turned on again at the trigger of the falling edge of the cycle period control signal CAC&BD, thus the first voltage V1 on the capacitor C1 is discharged to zero again and a next buck-boost switching cycle from the moment T4 to the moment T5 starts.

Figure 4:
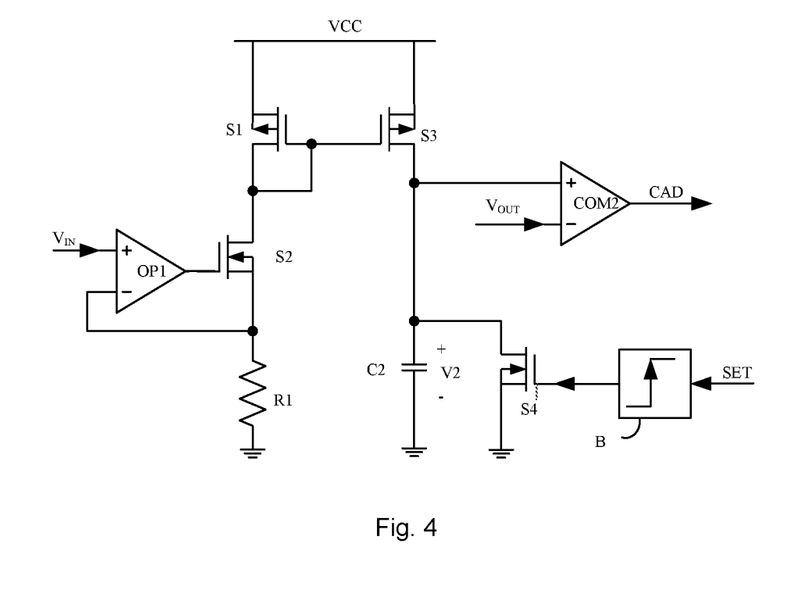
FIG. 4 illustrate a schematic diagram of an AD phase circuit in accordance with an embodiment of the present invention.

FIG. 4 illustrate a block diagram of the AD phase circuit shown in FIG. 3A in accordance with an embodiment of the present invention. The AD phase circuit is configured to provide the AD phase control signal CAD to control and maintain the duty cycle of the AD phase DAD at a preset duty threshold DON1, the preset duty threshold DON1 is smaller than the buck duty threshold DBKTH. In FIG. 4, the AD phase circuit comprises a first transistor S1, a resistor R1, a second transistor S2, a third transistor S3, an operational amplifier OP1, a capacitor C2, a fourth transistor S4, a trigger B and a comparator COM2 which are connected as FIG. 4 shown. The first transistor S1 has a first terminal coupled to the supply voltage VCC, a second terminal and a gate terminal, wherein the gate terminal is coupled to the second terminal of the first transistor S1. The second transistor S2 has a first terminal coupled to the second terminal of the first transistor S1, a second terminal and a control terminal. The resistor R1 has a first terminal coupled to the second terminal of the second transistor S2, and a second terminal coupled to the reference ground GND. The third transistor S3 has a first terminal coupled to the supply voltage VCC, a gate terminal coupled to the gate terminal of the first transistor S1, and a second terminal. The operational amplifier OP1 has a first input terminal to receive the input voltage VIN, a second input terminal coupled to the source terminal of the second transistor S2, and an output terminal coupled to the control terminal of the second transistor S2. The capacitor C2 has a first terminal coupled to the second terminal of the third transistor S3, and a second terminal coupled to the reference ground GND. The fourth transistor S4 has a first terminal coupled to the second terminal of the third transistor S3, a second terminal coupled to the reference ground GND, and a control terminal. The trigger B is configured to provide a pulse signal to the control terminal of the fourth transistor S4 based on the setting signal SET. The comparator COM2 has a first input terminal coupled to the second terminal of the third transistor S3, a second input terminal to receive the output voltage VOUT, and an output terminal to provide the AD phase control signal CAD.

Figure 5:
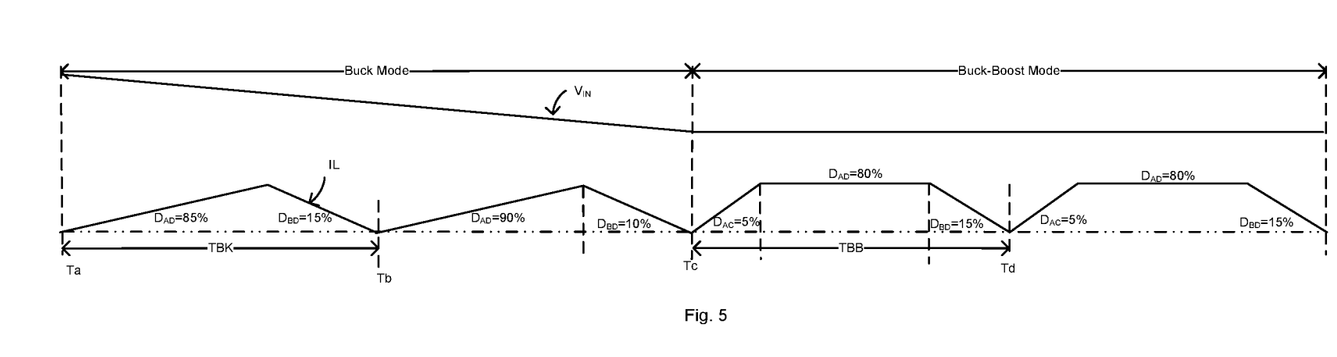
FIG. 5 illustrates waveform diagrams of an inductor current IL flowing through the inductor L of the buck-boost converter 100 as well as the input voltage VIN when the buck-boost converter 100 transits from the buck mode to the buck-boost mode in accordance with an embodiment of the present invention.

FIG. 5 illustrates waveform diagrams of an inductor current IL flowing through the inductor L of the buck-boost converter 100 as well as the input voltage VIN when the buck-boost converter 100 transits from the buck mode to the buck-boost mode in accordance with an embodiment of the present invention. In FIG. 5, the buck duty threshold DBKTH is set to be a value of 90%. The buck-boost converter 100 works in the buck mode with the buck switching cycles continuously during the period from the moment Ta to the moment Tc. Each of the buck switching cycles comprises the AD phase during which both of the first power switch SWA and the fourth power switch SWD are in the on state and the BD phase during which both of the second power switch SWB and the fourth power switch SWD are in the on state. The buck duty cycle DBK is increased from 85% in the first buck switching cycle (from the moment Ta to the moment Tb) to 90% in the second buck switching cycle (from the moment Tb to the moment Tb) with the decrease of the input voltage VIN. Thus the buck duty cycle DBK is increased to reach the buck duty threshold DBKTH, so the buck-boost converter 100 is required to transit from the buck mode with the buck switching cycles to the buck-boost mode with the buck-boost switching cycles. Compared to the buck switching cycles, each of the buck-boost switching cycles further comprises the AC phase during which the first power switch SWA and the third power switch SWC are in the on state. In each of the buck-boost switching cycles, the duty cycle of the AC phase DAC is determined by the reference signal REF, the feedback signal FB indicative of the output voltage VOUT and the inductor current sense signal CS. In FIG. 5, the duty cycle of the AC phase DAC is controlled to be 5%. It can be seen from FIG. 5 that the duty cycle of the AD phase DAD is decreased from 90% to the preset duty threshold DON1=80% with a buck duty hysteresis having a value of 10% when the buck-boost converter 100 is controlled to transit from the buck mode with the buck switching cycles to the buck-boost mode with the buck-boost switching cycles. The duty cycle of the AD phase DAD is controlled and maintained at the preset duty threshold DON1 during the following buck-boost switching cycles and the time period of the buck-boost switching cycle TBB equals the time period of the buck switching cycle TBK.

Figure 6:
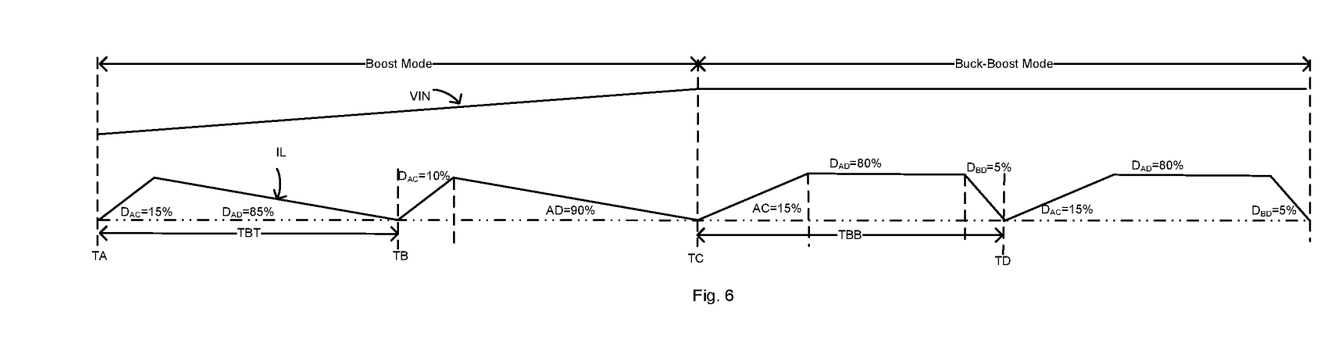
FIG. 6 illustrates waveform diagrams of an inductor current IL flowing through the inductor L of the buck-boost converter 100 as well as the input voltage VIN when the buck-boost converter 100 transits from the boost mode to the buck-boost mode in accordance with an embodiment of the present invention.

FIG. 6 illustrates waveform diagrams of an inductor current IL flowing through the inductor L of the buck-boost converter 100 as well as the input voltage VIN when the buck-boost converter 100 transits from the boost mode to the buck-boost mode in accordance with an embodiment of the present invention. In FIG. 6, the boost duty threshold DBTTH is set to be a value of 10%. The buck-boost converter 100 works in the boost mode with the boost switching cycles continuously during the period from the moment TA to the moment TC. Each of the boost switching cycles comprises the AC phase during which both of the first power switch SWA and the third power switch SWC are in the on state and the AD phase during which both of the first power switch SWA and the fourth power switch SWD are in the on state. The boost duty cycle DBT is decreased from 15% in the first boost switching cycle (from the moment TA to the moment TB) to 10% in the second boost switching cycle (from the moment TB to the moment TC) with the increase of the input voltage VIN. Thus the boost duty cycle DBT is decreased to reach the boost duty threshold DBTTH, so the buck-boost converter 100 is required to transit from the boost mode with the boost switching cycles to the buck-boost mode with the buck-boost switching cycles. Compared to the boost switching cycles, each of the buck-boost switching cycles further comprises the BD phase during which the second power switch SWB and the fourth power switch SWD are in the on state. In each of the buck-boost switching cycles, the duty cycle of the AC phase DAC is determined by the reference signal REF, the feedback signal FB indicative of the output voltage VOUT and the inductor current sense signal CS. In FIG. 6, the duty cycle of the AC phase DAC in each of the buck-boost switching cycles is controlled to be 15%. It can be seen from FIG. 6 that the duty cycle of the AD phase DAD is decreased from 90% to the preset duty threshold DON1=80% with a boost duty hysteresis having a value of 10% when the buck-boost converter 100 is controlled to transit from the boost mode to the buck-boost mode. The duty cycle of the AD phase DAD is controlled and maintained at the preset duty threshold DON1 during the following buck-boost switching cycles and the time period of the buck-boost switching cycle TBB equals the time period of the boost switching cycle TBT.

One of ordinary skill should know that, the duty cycle of the phase AD DAD is controlled and maintained at the preset duty threshold DON1 during each of the buck-boost switching cycles, wherein the preset duty threshold DON1 is set to be 80% in the embodiment shown in FIG. 5. And of course, this is just to provide an example and is not intended to be limiting, may be set to be other suitable duty cycle values in other embodiments.

One of ordinary skill in the art should know that although the buck-boost converter 100 in FIG. 5 and FIG. 6 is controlled to work in one of the buck mode, boost mode or buck-boost mode by detecting the buck duty cycle DBK and the boost duty cycle DBT. In other embodiments, the buck-boost converter 100 is controlled to work in the buck mode, the boost mode or the buck-boost mode by detecting the input voltage VIN and the output voltage VOUT.

A method for controlling the buck-boost converter shown in FIG. 1 comprises steps S11-S14. At step S11, setting the buck-boost converter to work in the buck mode, the boost mode or the buck-boost mode based on the input voltage VIN and the output voltage VOUT. At step S12, when the buck-boost converter is regulated to work in the buck mode, the switch module is regulated to operate with buck switching cycles continuously, wherein in each of the buck switching cycles, the first power switch SWA and the second power switch SWB are controlled to conduct on and off switching complementarily, while the third power switch SWC is maintained at the off state and the fourth power switch SWD is maintained at the on state, wherein each of the buck switching cycles comprise an AD phase during which both of the first power switch SWA and the fourth power switch SWD are in the on state and a BD phase during which both of the second power switch SWB and the fourth power switch SWA are in the on state. At step S13, when the buck-boost converter is regulated to work in the boost mode, the switch module is regulated to operate with boost switching cycles continuously, wherein in each of the boost switching cycles, the third power switch SWC and the fourth power switch SWD are controlled to conduct on and off switching complementarily, while the first power switch SWA is maintained at the on state and the second power switch SWB is maintained at the off state, wherein each of the boost switching cycles comprises an AC phase during which both of the first power switch SWA and the third power switch SWC are in the on state, and the AD phase. At step S14, when the buck-boost converter is regulated to work in the buck-boost mode, the switch module is regulated to operate with buck-boost switching cycles continuously, wherein each of the buck-boost switching cycles comprises the AC phase, the AD phase and the BD phase, wherein the duty cycle of the AC phase DAC is controlled and determined by a reference signal REF, a feedback signal VFB indicative of the output voltage VOUT and an inductor current sense signal CS indicative of a current passing through the inductor L. The duty cycle of the AD phase DAD is controlled and maintained at a preset duty threshold DON1, the time periods of the buck switching cycle, the boost switching cycle and the buck-boost switching cycle are all equal.

In one embodiment, step S14 comprises: sensing the output voltage and generating the feedback signal VFB indicative of the output voltage VOUT; generating a compensation signal COMP based on the reference signal REF and the feedback signal VFB; sensing the current flowing through the inductor L and generating the inductor current sense signal CS; comparing the inductor current sense signal CS with the compensation signal COMP; and terminating the AC phase when the inductor current sense signal CS is increased to reach the compensation signal COMP.

In one embodiment, when the buck-boost converter is arranged to switch from the buck mode to the buck-boost mode, the duty cycle of the AD phase DAD is regulated to decrease to the preset duty threshold DON1 with a decrement equaling a buck duty hysteresis, and when the buck-boost converter is arranged to switch from the boost mode to the buck-boost mode, the duty cycle of the AD phase DAD is regulated to decrease to the preset duty threshold DON1 with an decrement equaling a boost duty hysteresis, wherein the buck duty hysteresis or the boost duty hysteresis is 5%, 10% or 15%.

The advantages of the various embodiments of the buck-boost converter is not confine to those described above. These and other advantage of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A control circuit for regulating a buck-boost converter with an inductor and a switch module having a first power switch, a second power switch, a third power switch and a fourth power switch, wherein the first power switch and the second power switch are coupled in series between an input port and a reference ground with a first common node, the third power switch and the fourth power switch are coupled in series between an output port and the reference ground with a second common node, wherein the inductor is coupled between the first common node and the second common node, the switch module is controlled to on and off to convert an input voltage received at the input port to an output voltage at the output port, the control circuit comprising:

a buck mode control circuit, configured to control the buck-boost converter to work in a buck-mode by regulating the switch module to operate with buck switching cycles continuously, wherein in each of the buck switching cycles, the first power switch and the second power switch are controlled to conduct on and off switching complementarily, while the third power switch is maintained at the off state and the fourth power switch is maintained at the on state, wherein each of the buck switching cycles comprises an AD phase during which both of the first power switch and the fourth power switch are in the on state and a BD phase during which both of the second power switch and the fourth power switch are in the on state;

a boost mode control circuit, configured to control the buck-boost converter to work in a boost mode by regulating the switch module to operate with boost switching cycles continuously, wherein in each of the boost switching cycles, the third power switch and the fourth power switch are controlled to conduct on and off switching complementarily, while the first power switch is maintained at the on state and the second power switch is maintained at the off state, wherein each of the boost switching cycles comprises an AC phase during which both of the first power switch and the third power switch are in the on state and the AD phase; and a buck-boost mode control circuit, configured to control the buck-boost converter to work in a buck-boost mode by regulating the switch module to work with buck-boost switching cycles continuously, wherein each of the buck-boost switching cycles consists of three phases, the three phases are the AC phase, the AD phase and the BD phase, wherein the duty cycle of the AC phase is controlled and determined by a reference signal, a feedback signal indicative of the output voltage, and an inductor current sense signal indicative of a current flowing through the inductor, wherein the duty cycle of the AD phase is controlled and maintained at a preset duty threshold, and the time periods of the buck switching cycle, the boost switching cycle and the buck-boost switching cycle are all equal;

wherein the buck-boost mode control circuit comprises:
an AC phase circuit, configured to generate a setting signal to control the duty cycle of the AC phase based on the reference signal, the feedback signal and the inductor current sense signal;
an AD phase circuit, configured to control the switch module to work in the AD phase based on the setting signal, and further configured to generate an AD phase control signal to control and maintain the duty cycle of the phase AD at the preset duty threshold; and
a cycle period circuit, coupled to the AC phase circuit and the AD phase circuit to receive the setting signal and the AD phase control signal, and configured to generate a cycle period control signal to control the time period of the buck-boost switching cycle.

2. The control circuit of claim 1, further comprising a mode selection circuit, wherein the mode selection circuit comprises:
a buck duty cycle sensing and comparison circuit, configured to sense a buck duty cycle of the buck-boost converter and to compare the buck duty cycle with a buck duty threshold, wherein when the buck duty cycle is higher than the buck duty threshold, the buck-boost converter is regulated to transit from the buck mode to the buck-boost mode; and
a boost duty cycle sensing and comparison circuit, configured to sense a boost duty cycle of the buck-boost converter and to compare the boost duty cycle with a boost duty threshold, wherein when the boost duty cycle is less than the boost duty threshold, the buck-boost converter is regulated to transit from the boost mode to the buck-boost mode.

3. The control circuit of claim 2, wherein the preset duty threshold is less than the buck duty threshold.

4. The control circuit of claim 1, further comprising:
a mode selection circuit, configured to detect the input voltage and the output voltage, and configured to generate a buck mode enable signal, a boost mode enable signal and a buck-boost mode enable signal to control the buck-boost converter to operate in the buck mode, the boost mode or the buck-boost mode based on the input voltage and the output voltage.

5. The control circuit of claim 1, wherein
when the buck-boost converter is arranged to switch from the buck mode to the buck-boost mode, the duty cycle of the AD phase is regulated to decrease to the preset duty threshold with a decrement equaling a buck duty hysteresis; and
when the buck-boost converter is arranged to switch from the boost mode to the buck-boost mode, the duty cycle of the AD phase is regulated to decrease to the preset duty threshold with a decrement equaling a boost duty hysteresis.

6. The control circuit of claim 5, wherein the buck duty hysteresis or the boost duty hysteresis is 5%, 10% or 15%.

7. The control circuit of claim 1, wherein the AC phase circuit comprises:
an error amplifier, having a first input terminal configured to receive the reference signal, a second input terminal configured to receive the feedback signal, and an output terminal configured to provide a compensation signal based on the reference signal and the feedback signal; and
a comparator, having a first input terminal configured to receive the inductor current sense signal, a second input terminal configured to receive the compensation signal, and an output terminal configured to provide the setting signal based on the inductor current sense signal and the compensation signal.

8. The control circuit of claim 1, wherein the AD phase circuit comprises:
a first transistor, having a first terminal configured to receive a supply voltage, a second terminal and a gate terminal, wherein the gate terminal is coupled to the second terminal of the first transistor;
a second transistor, having a first terminal coupled to the second terminal of the first transistor, a second terminal and a control terminal;
a resistor, having a first terminal coupled to the second terminal of the second transistor, and a second terminal coupled to the reference ground;
a third transistor, having a first terminal configured to receive the supply voltage, a gate terminal coupled to the gate terminal of the first transistor, and a second terminal;
an operational amplifier, having a first input terminal configured to receive the input voltage, a second input terminal coupled to the second terminal of the second transistor, and an output terminal coupled to the control terminal of the second transistor;
a capacitor, having a first terminal coupled to the second terminal of the third transistor, and a second terminal coupled to the reference ground;
a fourth transistor, having a first terminal coupled to the second terminal of the third transistor, a second terminal coupled to the reference ground, and a control terminal;
a trigger, configured to provide a pulse signal to the control terminal of the fourth transistor based on the setting signal; and
a comparator, having a first input terminal coupled to the second terminal of the third transistor, a second input terminal configured to receive the output voltage, and an output terminal to provide the AD phase control signal.

9. The control circuit of claim 1, wherein the cycle period circuit comprises:
a first current source, having a first terminal coupled to a supply voltage, and a second terminal;
a switch, having a first terminal coupled to the second terminal of the first current source, and a second terminal;
a capacitor, having a first terminal coupled to the second terminal of the first switch, and a second terminal;
a first transistor, having a first terminal coupled to the first terminal of the capacitor, a second terminal coupled to the reference ground, and a control terminal;
a second current source, having a first terminal coupled to the supply voltage, and a second terminal;
a second transistor, having a first terminal coupled to the second terminal of the second current source, a second terminal coupled to the reference ground and a control terminal coupled to the first terminal of the capacitor;
a first inverter, having an input terminal coupled to the first terminal of the second transistor, and an output terminal;
a second inverter, having an input terminal coupled to the output terminal of the first inverter, and an output terminal to provide the cycle period control signal; and
a trigger, configured to provide a pulse signal to the control terminal of the first transistor based on the cycle period control signal.

10. The control circuit of claim 1, wherein
when the buck-boost converter is arranged to operate in the buck mode, the switch module is regulated to operate with a constant on time control mode, a constant off time control mode or a peak current pulse width modulation control mode; and
when the buck-boost converter is arranged to operate in the boost mode, the switch module is regulated to operate with a constant on time control mode, a constant off time control mode or a peak current pulse width modulation control mode.

* * * * *